United States Patent [19]

Hirokawa et al.

[11] Patent Number: 5,230,923
[45] Date of Patent: Jul. 27, 1993

[54] PROCESS AND APPARATUS FOR THE SUBSTANTIALLY CONTINUOUS MANUFACTURE OF A SILICON OXIDE DEPOSITION FILM ON A FLEXIBLE PLASTIC FILM

[75] Inventors: Atsushi Hirokawa; Kunihiko Ozaki, both of Tokyo, Japan

[73] Assignee: Toyo Ink Manufacturing Co., Ltd., Tokyo, Japan

[21] Appl. No.: 773,999

[22] Filed: Oct. 9, 1991

Related U.S. Application Data

[63] Continuation of Ser. No. 278,175, Dec. 1, 1988, abandoned.

[30] Foreign Application Priority Data

Dec. 17, 1987 [JP] Japan ................. 62-317349
Sep. 14, 1988 [JP] Japan ................. 63-230462

[51] Int. Cl.⁵ .............. C23C 14/08; C23C 14/24; C23C 16/40; C23C 16/54
[52] U.S. Cl. .............. 427/248.1; 427/255.3; 427/255.5; 118/718; 118/724; 118/727; 118/729
[58] Field of Search .............. 427/255.3, 255.5, 248.1; 118/718, 719, 724, 726, 727, 729

[56] References Cited

U.S. PATENT DOCUMENTS

| | | | |
|---|---|---|---|
| 2,771,378 | 11/1956 | Motter | 427/255.3 |
| 3,129,315 | 4/1964 | Radke et al. | 118/726 |
| 3,153,137 | 10/1964 | Drumheller | 118/726 |
| 3,394,678 | 7/1968 | Edwards et al. | 118/718 |
| 3,450,097 | 6/1969 | Firestone et al. | 118/726 |
| 3,620,802 | 11/1971 | Newman | 427/255.3 |
| 3,991,234 | 11/1976 | Chang et al. | 427/255.3 |
| 4,748,313 | 5/1988 | de Rudnay | 219/271 |

FOREIGN PATENT DOCUMENTS

| | | |
|---|---|---|
| 0082001 | 6/1983 | European Pat. Off. . |
| 78012953 | 8/1972 | Japan . |
| 51-48511 | 12/1976 | Japan . |
| 52-65183 | 5/1977 | Japan ................. 427/255.5 |
| 55-110127 | 8/1980 | Japan ................. 427/255.3 |
| 56-9906 | 1/1981 | Japan ................. 427/255.3 |
| 56-463262 | 3/1982 | Japan . |
| 61083029A | 9/1984 | Japan . |
| 61-83029 | 4/1986 | Japan ................. 427/255.3 |
| 0023868 | 6/1986 | Japan ................. 118/726 |
| 1185790 | 3/1970 | United Kingdom ...... 427/255.5 |

*Primary Examiner*—Michael Lusigan
*Assistant Examiner*—Bret Chen
*Attorney, Agent, or Firm*—Wenderoth, Lind & Ponack

[57] ABSTRACT

A process and apparatus for the substantially continuous manufacture of a silicon oxide deposition film on a traveling flexible plastic film. The process comprises evaporating a deposition material composed mainly of silicon and silicon oxide or silicon oxide alonem by heating to continuously form a deposition layer composed mainly of silicon oxide and having a thickness of from 100 to 3,000 Å on the surface(s) of a travelling flexible plastic film, wherein a material shaped from the above deposition material is evaporated by heating while the material is supplied to a heat evaporating portion substantially continuously, and an evaporation residue is discharged from the heat evaporating portion substantially continuously.

9 Claims, 5 Drawing Sheets

FIG. 19 stoichiometric compound having an SiO compositional ratio of 1:1, and there are only obtained compounds represented by formula of $SiO_x$ (wherein x represents about 1, generally 0.9 to 1.1). Usually, such compounds are called silicon monoxide. That is, commercially available "silicon monoxide" consists of Si, SiO, $Si_2O_3$, $Si_3O_4$ and $SiO_2$. Further, so-called silicon monoxide above is a considerably unstable, subliming material under deposition conditions exceeding 1,000° C. For example, it undergoes decomposition into silicon and oxygen gas, or it undergoes oxidation in the presence of a very small amount of oxygen, or the like.

PROCESS AND APPARATUS FOR THE SUBSTANTIALLY CONTINUOUS MANUFACTURE OF A SILICON OXIDE DEPOSITION FILM ON A FLEXIBLE PLASTIC FILM

This application is a continuation of now abandoned application Ser. No. 07/278,175 filed on Dec. 1, 1988.

FIELD OF THE INVENTION

This invention relates to a process for the manufacture of a flexible plastic film having a deposition layer comprising a silicon oxide as a main component, and an apparatus usable therefor.

PRIOR ARTS OF THE INVENTION

Japanese Patent Publication No. 12953/1978 proposes a transparent plastic film comprising a transparent flexible film and a silicon oxide deposition layer formed thereon as one which has high gas barrier properties. And, Japanese Patent Publication No. 48511/1976 describes that silicon monoxide is usually used as a deposition material to give such a deposition layer, that silicon and silicon dioxide are also used depending upon requirement for use and these components are in the form of powders, particles or rods, that the deposition is carried out using a continuous vacuum evaporation coater and, that the heating method in a vacuum evaporation coater is preferably a high frequency induction heating method, however, the other methods such as resistance heating and electron beam heating may be used.

Figure 1:
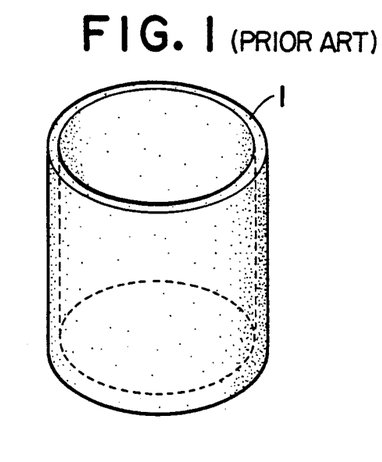
FIGS. 1 and 2 are perspective views schematically showing the heat evaporating portions of conventional continuous vacuum evaporation coaters of the batch type.
Figures 2, 4:
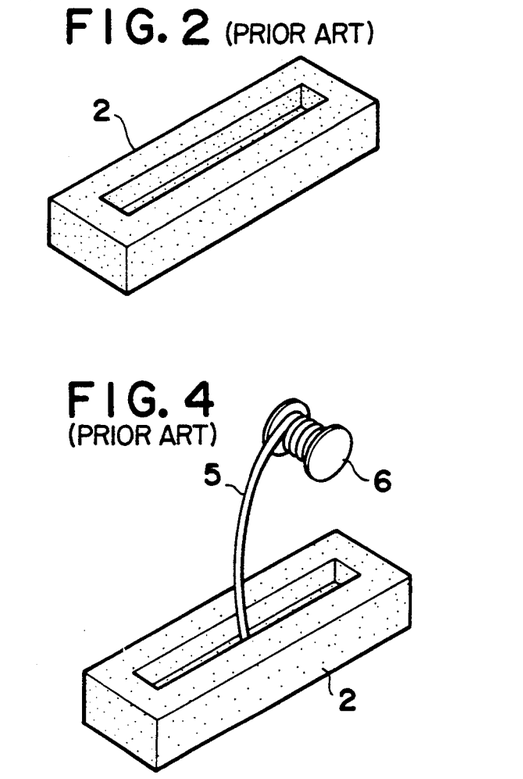
FIGS. 3 and 4 are perspective views schematically showing the continuous supply devices of a deposition material in a conventional continuous vacuum evaporation coater.
Figure 3:
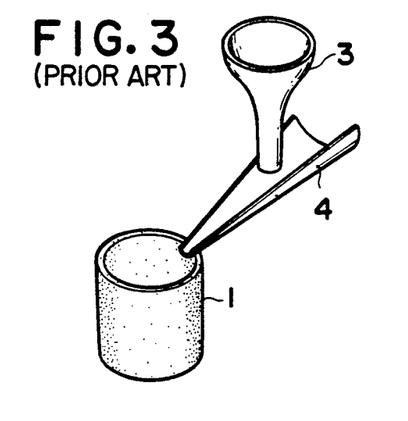
Figures 5, 6:
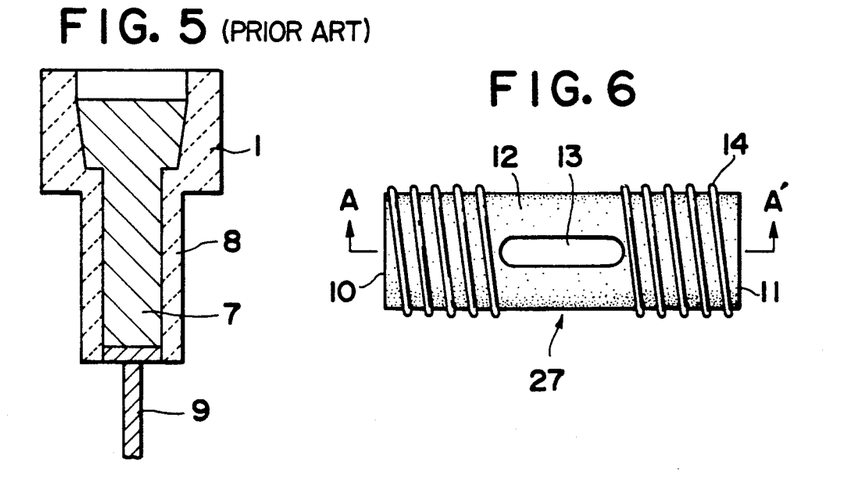
FIG. 5 is a cross sectional view of the continuous supply device of a deposition material in a conventional continuous vacuum evaporation coater.
FIG. 6 is a plan view of one embodiment of the heat evaporation member of this invention.

In general, this continuous vacuum evaporation coater is of a batch type which uses as, a heat evaporating portion, a crucible 1 shown in FIG. 1 and a boat 2 shown in FIG. 2. As described in "Thin Film Handbook" (published by OHM-sha in December 1983), there are also other proposals of (1) a method which comprises continuously supplying a deposition material, which is shaped into small particles having a suitable size, from a hopper 3 through a shooter 4 to a crucible 1 (FIG. 3), (2) a method which comprises continuously supplying an aluminum wire from a supply portion 6 to a boat 2 (FIG. 4), and (3) a method which comprises placing, below a crucible 1, a container 8 containing an replenishing deposition material 7 and continuously supplying the replenishing material 7 into the crucible 1 by using a driving shaft 9 (FIG. 5).

According to the present inventors' study, however, it was found that when a combination of silicon and silicon oxide or silicon oxide alone is deposited, none of the above deposition methods succeed in continuously forming, on a travelling film, a deposition layer free from non-uniformity in gas barrier properties, i.e., a deposition layer with stable gas barrier properties. That is, the gas permeability of a deposition film so obtained varies depending upon courses of time in forming deposition layer, and the non-uniformity in its gas barrier properties markedly appears, particularly, after retort treatment in the case of use as a food packaging material.

The present inventors assiduously investigated causes for the above defects. As a result, it was found that the composition of silicon monoxide or a mixture of silicon and silicon dioxide is likely to change at the time of depositing it. Namely, although silicon monoxide can be obtained by oxidation of silicon, reduction of silicon dioxide or reaction between silicon and silicon dioxide, it is very difficult to obtain a stoichiometric compound having an SiO compositional ratio of 1:1, and there are only obtained compounds represented by formula of $SiO_x$ (wherein x represents about 1, generally 0.9 to 1.1). Usually, such compounds are called silicon monoxide. That is, commercially available "silicon monoxide" consists of Si, SiO, $Si_2O_3$, $Si_3O_4$ and $SiO_2$. Further, so-called silicon monoxide above is a considerably unstable, subliming material under deposition conditions exceeding 1,000° C. For example, it undergoes decomposition into silicon and oxygen gas, or it undergoes oxidation in the presence of a very small amount of oxygen, or the like.

Further, another large cause for non-uniformity in the gas barrier properties of the deposition film is that easiness of evaporation varies among the components of the above mixture. For example, silicon monoxide is evaporated at a temperature of 1,000° to 1,100° C., whereas silicon dioxide and silicon show difficulty in evaporation under the above conditions.

When a mixture of silicon and silicon dioxide is used as a deposition material, silicon monoxide is formed and deposited. However, the composition of this formed silicon monoxide is not constant, either, and the composition and thickness of deposition layer vary from the beginning to the end during the deposition.

SUMMARY OF THE INVENTION

It is an object of this invention to provide a process for the manufacture of a deposition film which is free from any change in its gas barrier properties caused depending upon the course of times in forming a deposition layer on a travelling flexible plastic film from a material of a combination of silicon and silicon oxide or silicon oxide alone and which exhibits excellent gas barrier properties.

It is another object of this invention to provide an apparatus capable of manufacturing a deposition film which is free from any change in its gas barrier properties caused depending upon the course of times in forming a deposition layer on a travelling flexible plastic film from a material of a combination of silicon and silicon oxide or silicon oxide alone and which exhibits excellent gas barrier properties.

It is still another object of this invention to provide a process for the manufacture of a deposition film in which the thickness of the deposition layer formed on the flexible plastic film does not change from the beginning to the end during the deposition, and an apparatus usable for said process.

It is yet another object of this invention to provide a process for the manufacture of a deposition film of which the gas barrier properties are scarcely deteriorated even after retort treatment, and an apparatus usable for said process.

This invention provides a process for the manufacture of a deposition film which comprises evaporating a deposition material composed mainly of silicon and silicon oxide or silicon oxide alone by heating to continuously form a deposition layer composed mainly of silicon oxide and having a thickness of from 100 to 3,000 Å on the surface of a travelling flexible plastic film; wherein a material shaped from the above deposition material is evaporated by heating while said material is being supplied to a heat evaporating portion substantially continuously, and an evaporation residue is discharged from the heat evaporating portion substantially continuously.

This invention provides an apparatus usable in the above process for the manufacture of a deposition film, which comprises a vacuum chamber and, within the vacuum chamber, means to allow a flexible plastic film to travel continuously, a heat evaporation member having means to hold a shaped deposition material and means to evaporate the shaped deposition material, said holding means having a supply port of said shaped deposition material, an outlet of evaporation residue and an opening for evaporation of the deposition material, and means to substantially continuously supply the shaped deposition material connected to said supply port to the heat evaporation member and to substantially continuously discharge evaporation residue from the heat evaporation member.

DETAILED DESCRIPTION OF THE INVENTION

The present inventors have made further studies and as a result, they have found that by evaporating the deposition material under heat such that evaporation residue does not remain in the heat evaporating portion, the composition and thickness of a deposition layer on a travelling film unexpectedly become uniform from the beginning to the end during the deposition and the gas barrier properties of the deposition film are excellent. Thus, this finding has led to this invention.

In this invention, no special limitation is imposed on the flexible plastic film. Examples of the materials therefor include polyester, polyamide, polypropylene, fluorine polymer, polycarbonate, polyimide, polyethylene, polyvinyl chloride, saponified ethylene-vinyl acetate copolymer, etc., and these materials may be used by applying a silane coupling agent, primer or the like on the surface thereof or subjecting these materials to surface treatment by corona discharge, low temperature plasma, etc. Plastic films, which are monoaxially or biaxially stretched, may also be used.

In general packaging, the use of a biaxially stretched polypropylene film is preferred in terms of gloss and strength. In the field of electronic materials, a fluorine polymer film and a polyester film are used. In the case where the deposition films are used for food packaging which are subjected to a retorting or a sterilizing by boiling, it is desirable to use a polyester film or polyamide film of which the surface on the deposition side is not subjected to corona discharge treatment, low temperature plasma treatment, etc. When the deposition is effected on the surfaces of the polyester film and polyamide film which are subjected to such surface treatment, the resultant deposition layer is in some cases detached at the time of retorting or boiling. The reason therefor is not clear. Presumably, however, the hydrophilic nature of the film surface is increased by the surface treatment and therefore, the effect of water increases at the retorting or boiling time. The thickness of the plastic film is preferably 5 to 300 $\mu$m in terms of easiness of taking-in and prevention of occurrence of stretching, shrivelling, cracking, etc., at the time of taking the film in. In addition, it is preferable to use a preliminary dried plastic film in order to enhance the uniformity of the thickness of the deposition layer and the adhesion strength between the deposition layer and the plastic film.

The above flexible plastic film is provided, on its one surface or both surfaces, with a transparent deposition layer mainly composed of silicon oxide and having a thickness of 100 to 3,000 Å. When the thickness of the transparent deposition layer is less than 100 Å, the gas barrier properties of the resulting deposition film are insufficient. When the thickness of the transparent deposition layer is more than 3,000 Å, the resulting deposition layer is likely to undergo cracking.

The transparent deposition layer is formed on the flexible plastic film by supplying a shaped material, which is obtained by shaping material containing silicon and silicon oxide or silicon oxide alone to the heat evaporating portion continuously and evaporating the material by heating in the heat evaporating portion.

There is used a combination of silicon and silicon oxide or silicon oxide alone as the deposition material, and at least one member selected from the group consisting of $SiO$, $Si_2O_3$, $Si_3O_4$ and $SiO_2$ is used as the silicon oxide. These silicon compounds may be crystalline or amorphous. In order to improve the durability, strength, etc., of the deposition layer, not more than 10%, based on the above deposition material, of silicon compounds other than the above-specified silicon oxides, or of alloys or compounds such as oxides, silicides, silicates, fluorides, nitrides, carbides, etc., of metals other than silicon or a mixture of these may be incorporated to the above deposition material. Examples of these metals include tin, magnesium, aluminum, indium, manganese, silver, etc. The use of a small amount of metal in combination gives an effect of improving the degree of vacuum further owing to a reaction thereof with residual oxygen in a vacuum chamber. Among these metals, tin and indium show good stability in deposition and give a desirable result.

The deposition material made of these components is prepared into a shaped material by optionally adding a binder, lubricant, degrading agent, etc., in order to ease its continuous supply and discharge and prevent its splashing during the deposition, and shaping the mixture, in wet or dry condition, into a cylindrical, cubic, rectangular, parallelepiped-like, tablet-like, pellet-like, rod-like or wire-like form by granulation, compression molding, extruding or other method. In order to increase the strength of the shaped material and remove water, gas, impurities, etc., contained in the shaped material, it is preferable to dry or sinter the material in air, inert gas or vacuum during or after the shaping. The cylindrical or pillar-like, especially, cylindrical or tablet-like form of the shaped article is preferable in terms of easiness of handling and shaping. In the case when the deposition material is in the cylindrical form, it is desirable that the so-shaped deposition material has a diameter of not more than 300 mm at the most, preferably 10 to 100 mm, in terms of prevention of its breakage and prevention of splashing during the deposition. And, in the case when the deposition material is in powder form and the shaping is carried out by compression molding, it is preferable to use a powder having a particle size of smaller than 100 mesh, especially smaller than 200 mesh, in terms of moldability and reactivity during the deposition. Further, the shaped deposition material may be subjected to sintering treatment as required in order to improve its physical properties.

In this invention, the heat evaporating portion comprises a heat evaporation member having means to hold the shaped deposition material and means to evaporate the shaped deposition material by heating, said holding means having a supply port of the shaped deposition material, an outlet of evaporation residue and an opening for evaporation of the deposition material.

As means for evaporation by heating in this invention, there are used conventionally known heating methods such as resistance heating method, electron beam heating method, and high frequency induction heating method.

FIGS. 6 to 12 show embodiments of the heat evaporation members of this invention.

Figure 7:
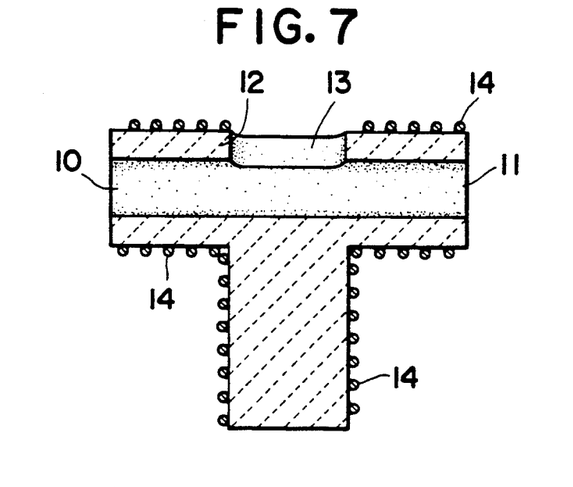
FIG. 7 is a cross sectional view taken from A—A' of the heat evaporation member shown in FIG. 6.
Figure 8:
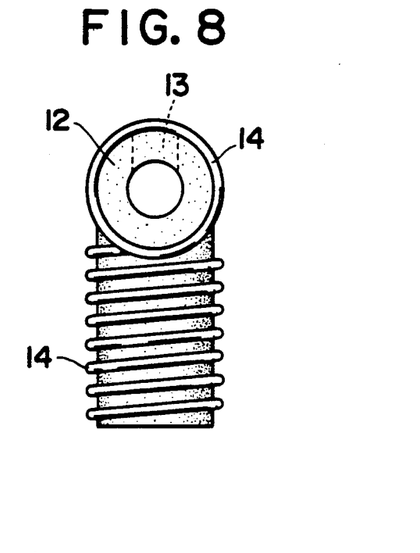
FIG. 8 is a side view of the heat evaporation member shown in FIG. 6.

FIGS. 6 to 8 show a heat evaporation member having a holding means 12 which is circular in the inner cross section and which has a deposition material supply port 10 and an evaporation residue outlet 11, one opening 13 on the surface thereof along a major axis of the holding means 12 and heating means which is a high frequency induction coil 14. FIG. 6 is a plan view of said heat evaporation member, FIG. 7 is a cross sectional view taken from A—A' and FIG. 8 is a side view of said member.

Figure 9:
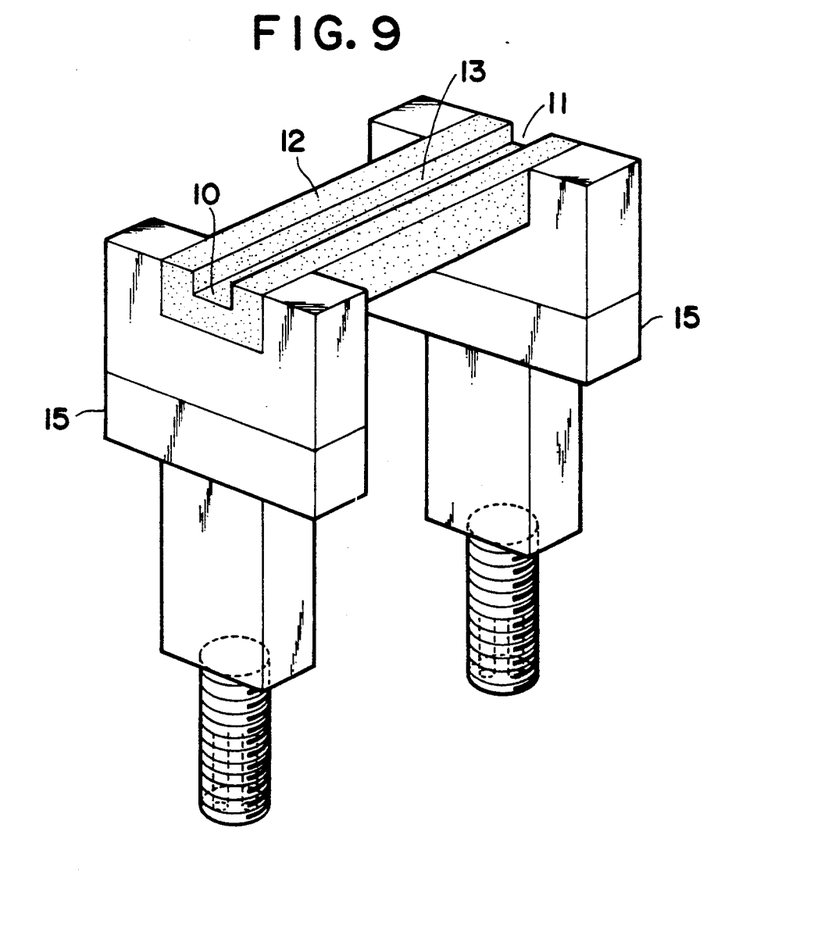
FIG. 9 is a plan view of one embodiment of the holding means of this invention.

FIG. 9 is a perspective view of a heat evaporation member which has a holding means having an opening 13 extending along the entire length of the holding means and a U-shaped letter-shaped inner cross-section and in which the heating means is a resistance heating having electrodes 15 at the vicinity of both end portions of the holding means 12. A cooling water is circulated within the electrodes so as to dissipate heat which is generated during the deposition.

Figure 10:
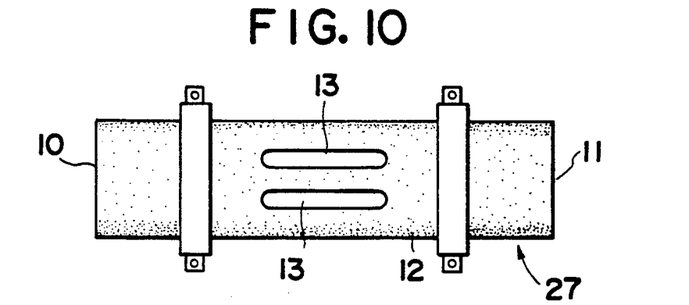
FIG. 10 is a plan view of another embodiment of the heat evaporation member of this invention.
Figure 11:
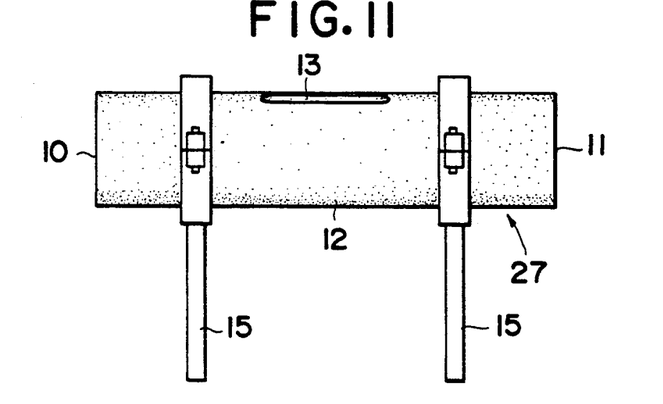
FIGS. 11 and 12 are front and side views of the above embodiment referred to in FIG. 10.
Figure 12:
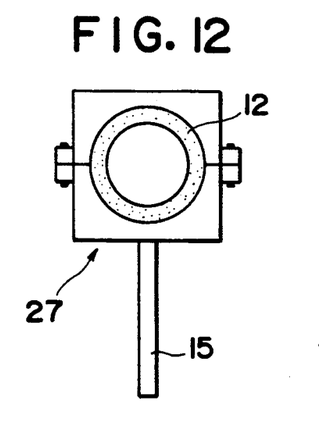

FIGS. 10 to 12 show a heat evaporation member having two openings 13 along the upper surface of a holding means 12 of which the inner cross section is circular and heating means which is a resistance heating by an electrode 15. FIG. 10 is a plan view of said heat evaporation member, FIG. 11 is a front view of said member and FIG. 12 is a side view of said member.

A heat evaporation member having a preliminary heating portion, which can heat the upper side portion of the shaped deposition material, between the supply port 10 and the opening 13 as shown in FIGS. 6 to 8 or FIGS. 10 to 12 is more preferably usable than a heat evaporation member which is cut open all along the upper side thereof as shown in FIG. 9.

The heat evaporation member may be provided with means to preliminarily heat the shaped evaporation material or means for gas removal. The material for the holding means depends on the heating methods, and said material is selected from alumina, graphite, titanium diboride, boron nitride composite sintered body, aluminum nitride, berylium oxide, and the like, and, preferably, those having less reactivity with the deposition material are used.

In terms of producibility and universality, high frequency induction heating and resistance heating are preferably used as the heating method. An auxiliary heater may be used in combination in order to make the temperature distribution in the heating portion uniform or to intentionally make the same nonuniform.

Figure 13:
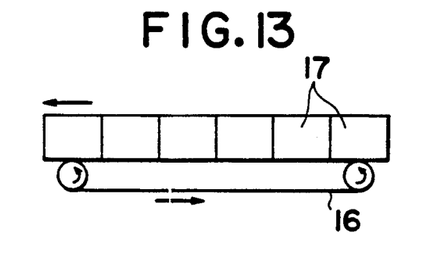
FIGS. 13 and 14 are schematic views showing embodiments of means to supply and discharge shaped material of a deposition material in this invention.
Figure 14:
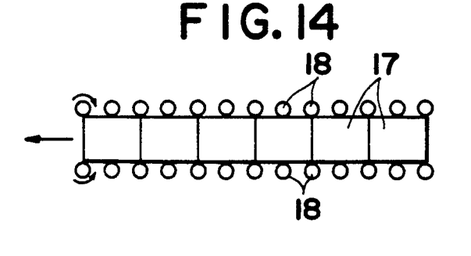

In this invention, there is no limitation on means to supply and discharge the shape deposition material substantially continuously. For example, it is possible to use a device shown in FIG. 13 in which the shaped deposition material 17 is continuously supplied by using an endless belt 16, and another device shown in FIG. 14 in which conveyor rolls 18 are used to continuously supply the shaped deposition material.

Figure 15:
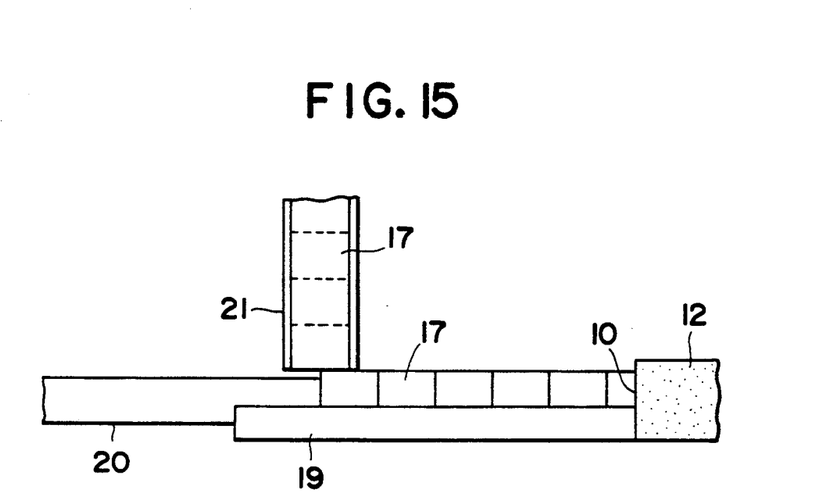
FIG. 15 is a front view of another embodiment of the means to supply and discharge shaped material of a deposition material in this invention.

A device in which the supply is partially intermittent as shown in FIG. 15 may also be used since such a supply substantially has an effect identical to that of the continuous supply. In FIG. 15, the shaped material 17 is placed in a supply member 19 having a U-shaped holder connected to the shaped deposition material supply port 10 of the heat evaporating portion, and the right end of a feeding rod 20, which is movable in a horizontal direction right and left, contacts the left side of the shaped material 17. This feeding rod 20 moves rightward by a length of the shaped material 17 at a pre-determined slow constant speed (e.g., 5 mm/minute) to supply shaped material to the heat evaporating portion. After the rod 20 moves to the predetermined position, it is allowed to move leftward by a length of the shaped material 17 at a comparatively high speed (e.g., 50 cm/minute) whereby shaped material 17 (pellet) is allowed to fall from a replenishing means 21 to the supply member 19. Immediately thereafter, the feeding rod 20 again moves rightward at the previous slow speed to supply shaped material to the heating member. In this way, the supply of the shaped material 17 to the heating member is seemingly intermittent, but is substantially continuous.

The direction in supply of the shaped deposition material may be the same as, or different from, the direction in travel of the flexible plastic film.

In this invention, there is no limitation on means to discharge deposition residue from the heating portion.

Even without any special means, the deposition residue can be continuously discharged through the holding means 12 by said means to continuously supply the shaped deposition material 17.

Figure 16:
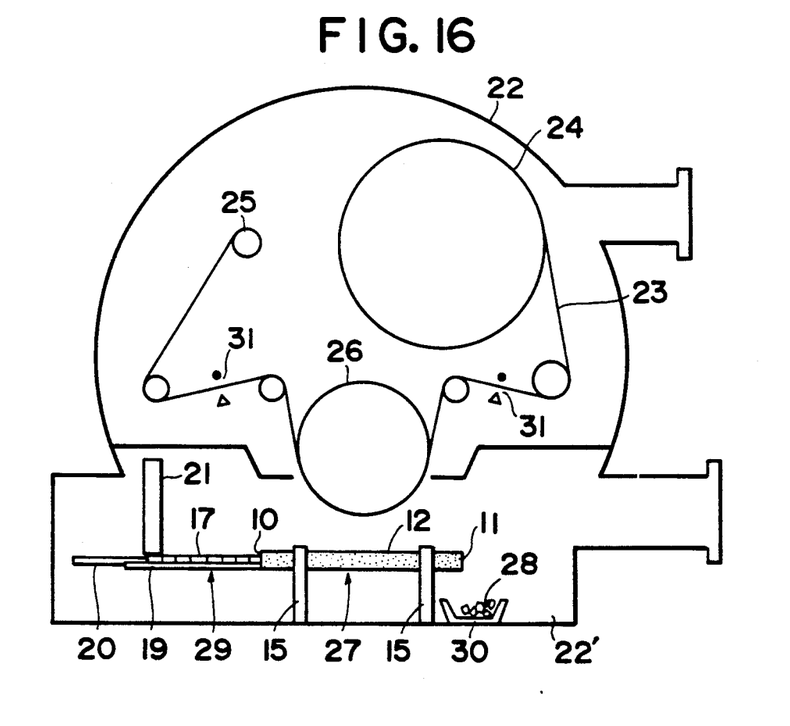
FIG. 16 shows a schematic view of the vacuum evaporation coater of this invention.

FIG. 16 is a schematic view showing an apparatus for the manufacture of a deposition film in this invention. Said apparatus has vacuum chambers 22,22' connected to vacuum means (not shown). Within the vacuum chamber 22, there are a feeding roll 24 which allows a flexible plastic film 23 to travel, a taking-in roll 25 having actuating means (not shown) and a chill roll 26 which projects the lower portion into the vacuum chamber 22' side and is placed between the above two rolls. Within the vacuum chamber 22', there are a heat evaporation member 27 below the deposition roll 26 and means to substantially continuously supply the shaped deposition material 17 to the heat evaporation member 27 and discharge evaporation residue.

Opposite to a heat evaporation means 27 of the supply discharge means 29, there is placed the replenishing means 21 which sequentially replenishes the supply member 19 with the shaped deposition material 17. The shaped deposition material 17 is substantially continuously supplied to the heat evaporation means 27 by forward and backward movement of the feeding rod 20, and the evaporation residue 28 is substantially continuously discharged to a pan 30. The heat evaporation member 27 uses a direct resistance heating method using an electrode 15.

The number of each of the heat evaporation member 27 and the supply discharge means 29 of shaped deposition material may be suitably selected depending upon the width of travelling flexible plastic films. Usually, one set of heat evaporation member and supply discharge means are placed every 10 to 20 cm.

The degree of vacuum of the vacuum chamber 22, 22' is not more than $10^{-3}$ Torr, preferably $10^{-4}$ Torr. The thickness of the deposition layer can be suitably controlled by a film thickness sensor 31 which detects the thickness of the deposition layer.

According to this invention, there are provided a process for the manufacture of a deposition film having a deposition layer mainly composed of silicon oxide, having uniform composition and thickness of a deposition layer from beginning to end during the deposition and having excellent gas barrier properties, and an apparatus usable for said process.

According to this invention, there are provided a process for manufacturing the above deposition film very effectively in producibility and an apparatus usable for said process.

EXAMPLES

This invention will be illustrated more in detail according to Examples herein below.

EXAMPLE 1

An equimolar mixture of silicon and silicon dioxide was compression molded to obtain a tablet-shaped material having a diameter of 40 mm and thickness of 35 mm. A heat evaporation member shown in FIGS. 6 to 8 was used in an apparatus shown in FIG. 16. The above shaped material was continuously supplied to a supply port of a heat evaporation member made of boron nitride composite sintered body at a speed of 5 mm/minute, and heated to 1,350° C. with a high frequency induction heating device under vacuum of $0.7 \times 10^{-4}$ Torr to carry out deposition on a polyethylene terephthalate film having a thickness of 12 μm and travelling at a speed of 30 m/minute. In addition, the thickness of the deposition layer was controlled by using an optical intensity monitor.

Figure 17:
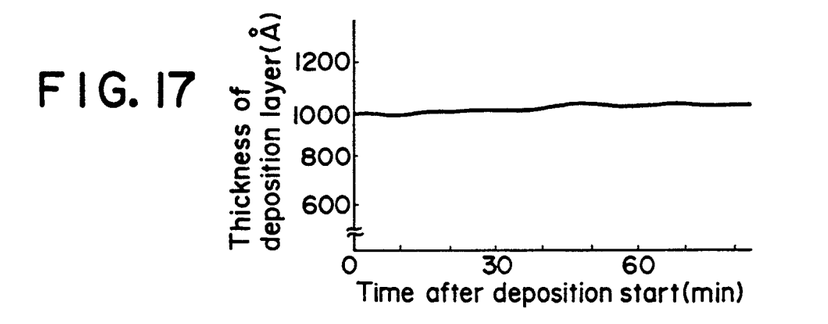
FIG. 17 is a chart showing a relationship between period of time after deposition start and thickness of a deposition layer in Example 1.

Measurement of the thickness of the deposition layer on the resultant deposition polyethylene terephthalate film by taking an electron photomicrograph of the cross section of the film showed that the thickness of the deposition layer was constant, i.e., about 1,000 Å, regardless of points of time after the deposition was started, as is shown in FIG. 17.

Figure 18:
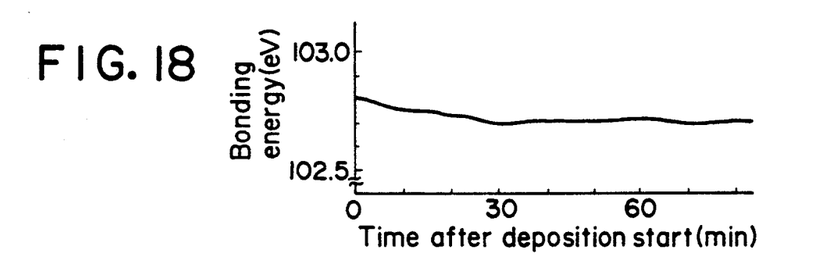
FIG. 18 is a chart showing a relationship between the period of time after the start of deposition and the bonding energy of 2 p orbital of silicon atom during the deposition in Example 1.

The measurement of the bond energy of 2 p orbital of silicon atom in the deposition layer of the resultant deposition polyethylene terephthalate film by X ray photoelectron spectroscopic analysis showed that the bond energy is nearly constant and the composition of the deposition layer was nearly constant regardless of points of time after the deposition was started, as is shown in FIG. 18.

The bond energies of 2 p orbitals of silicon atoms in silicon dioxide and silicon are 103.4 eV and 98.6 eV, respectively.

COMPARATIVE EXAMPLE 1

The procedure of Example 1 was repeated except that 2 pieces of the tablet-shaped material obtained in Example 1 were charged into a usual crucible made of graphite shown in FIG. 1, that the above shaped material was not replenished and that the travelling speed of a polyethylene terephthalate film was set at 10 m/minute, and the high frequency induction heating was carried out to give a deposition on polyethylene terephthalate film. Incidentally, the volume of evaporation residue 70 minutes after the deposition was started was 26 cm$^3$.

Figure 19:
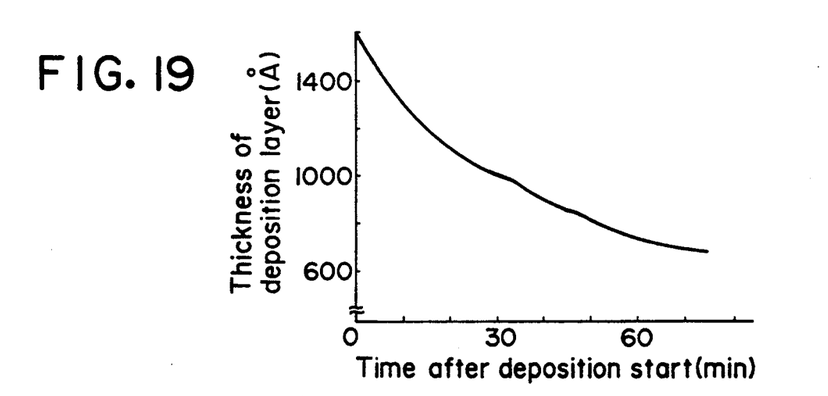
FIG. 19 is a chart showing a relationship between the period of time after the start of deposition and the thickness of a deposition layer in Comparative Example 1.

It was found that the thickness of the deposition layer of the resultant deposition polyethylene terephthalate film decreased with passage of time after the deposition was started, as is shown in FIG. 19.

The 2 p orbital bond energy of silicon atom in the deposition layer of the resultant desposition polyethylene terephthalate film changed, and it was found that the composition of the deposition layer shifted toward silicon dioxide with passage of time after the deposition was started.

It is thought that the causes for the gradual decrease in thickness of the deposition layer, the change in its composition and occurrence of evaporation residue are because the volume of the shaped deposition material decreased with passage of time, and that, due to a long stay of the shaped deposition material in the crucible, it reacted with residual oxygen and oxygen emitted from the film and silicon was eluted toward the surface of the shaped deposition material to change the silicon/silicon dioxide compositional ratio, thus the reaction to form SiO was impaired:

EXAMPLE 2

The deposition layer surface of the deposition polyethylene terephthalate film obtained in Example 1 was bonded to the surface of a casted polypropylene film having a thickness of 70 μm by using a polyurethane adhesive "Adcote 900" (trade name, made by Toyo Morton Co., Ltd.) and a pouch was prepared therefrom according to customary method. The pouch was filled with distilled water as contents and sealed. Then the pouch was subjected to retort sterilization treatment at 125° C. for 30 minutes. Then, the pouch was opened and the oxygen permeability (OP) was measured according to ASTM-D-3985-81 to show 1.4 ml/m²-24 hrs-1 atm-25° C.-100% RH. In addition, the OP before the retort sterilization treatment was 1.0 ml/m²-24 hrs-1 atm-25° C.-100% RH. Thus, it was found that there was little decrease in the OP after retort sterilization treatment.

COMPARATIVE EXAMPLE 2

Pouches were prepared by repeating Example 2 except for the use of those three portions of the deposition polyethylene terephthalate film obtained in Comparative Example 1 which had deposition layer thicknesses of 1,400 Å, 1,000 Å and 700 Å, respectively. Then these pouches were subjected to retort sterilization treatment and the OPs were measured before and after the retort sterilization treatment.

Table 1 shows the results of the above measurement.

TABLE 1

| Thickness of deposition layer (Å) | OP※ Before retort sterilization treatment | OP※ After retort sterilization treatment |
|---|---|---|
| 1,400 | 0.7 | 1.0 |
| 1,000 | 1.1 | 2.5 |
| 700 | 1.3 | 4.5 |

※OP: unit ml/m²-24 hrs-1 atm-25° C.-100% RH

EXAMPLE 3

A silicon/silicon monoxide/silicon dioxide mixture having a molar ratio of 35/30/35 was compression-molded to obtain pillar-shaped deposition material having a length of 25 mm, width of 25 mm and thickness of 15 mm.

A heat evaporation member shown in FIG. 9 was used in an apparatus shown in FIG. 16. The resultant shaped material was supplied to a supply port of a heat evaporation member made of graphite at a speed of 5 mm/minute, and heated to 1,300° C. under vacuum of $0.7 \times 10^{-4}$ Torr with using a resistance heating method to carry out deposition on a polyethylene terephthalate film travelling at a speed of 30 m/minute.

The thickness of the resultant deposition layer was nearly 1,000 Å, i.e., constant, regardless of points of time after the deposition was started.

Pouches were prepared by using the deposition polyethylene terephthalate film obtained above in the same way as in Example 2. Then, along the procedures mentioned in Example 2, and retort sterilization treatment was carried out, and OPs were measured before and after the retort sterilization treatment. Table 2 shows results of the measurement.

COMPARATIVE EXAMPLE 3

Example 3 was repeated except that the supply of the pillar-shaped deposition material was stopped during the course of time, and pouches were prepared by using deposition films obtained 10 minutes, 30 minutes and 60 minutes after the supply was stopped. Retort sterilization treatment was carried out, and OPs were measured before and after the retort sterilization treatment. Table 2 shows results of the measurement.

TABLE 2

| | Thickness of deposition layer (Å) | OP※ Before retort sterilization treatment | OP※ After retort sterilization treatment |
|---|---|---|---|
| Ex. 3 | 1,000 | 1.0 | 1.2 |
| CEx. 3 (※※) | | | |
| 10 minutes | 850 | 1.1 | 2.0 |
| 30 minutes | 700 | 1.3 | 4.0 |
| 60 minutes | 400 | 1.8 | 10.0 |

※OP: Unit ml/m²-24 hrs-1 atm-25° C.-100% RH.
※※: Time after the supply was stopped.

EXAMPLE 4

A silicon/tin/silicon dioxide mixture having a molar ratio of 10/1/10 was compression-molded to obtain a tablet-shaped material having a diameter of 15 mm and thickness of 25 mm. A heat evaporation member shown in FIG. 10 was used in an apparatus shown in FIG. 16. The resultant shaped material was supplied to the supply port of a heating evaporation member made of graphite shown at a speed of 5 mm/minute in a supply method as shown in FIG. 10. The shaped material was heated to 1,350° C. under vacuum of $0.4 \times 10^{-4}$ by using a direct resistance heating device to carry out a deposition in the same way as in Example 1. Then, the thickness of the deposition layer was measured to show that the thickness was about 1,000 Å or nearly constant regardless of the points of time during the deposition and the presence of tin. It was possible to maintain the atmosphere of high degree of vacuum and stably carry out the deposition.

What we claim is:

1. A process for the manufacture of a uniform deposition film on a traveling flexible plastic film using an apparatus which comprises a vacuum chamber and, within the vacuum chamber, a heat evaporation member having an evaporating means for evaporating a shaped deposition material under heat and a holding means for holding the shaped deposition material, the holding means having a supply port for supplying the shaped deposition material to the holding means, an outlet for discharging an evaporation residue of the shaped deposition material from the holding means which is distinct from and connected to the supply port by a flow path, and an opening for venting an evaporated deposition material from the flow path between the supply port and the outlet, the vacuum chamber also comprising a means for substantially continuously supplying the shaped evaporation material to the heat evaporation member through the supply port and for substantially continuously discharging the evaporation residue from the heat evaporation member through the outlet, and a means for allowing a flexible plastic film to travel continuously therein, the process comprising evaporating a shaped deposition material composed mainly of a combination of silicon and silicon oxide or silicon oxide alone at a substantially constant rate within the vacuum chamber of the apparatus by heating the shaped deposition material on the holding means of the heat evaporation member, the shaped deposition material being evaporated at a substantially constant rate by supplying the shaped deposition material to the heat evaporation member substantially constantly through the supply port, by venting the evaporated deposition material from the heat evaporation member substantially constantly through the opening for venting, and by discharging the evaporation residue of the shaped deposition material from the heat evaporation member substantially constantly through the outlet, while at the same time passing a continuous flexible plastic film in the vacuum chamber, wherein a uniform deposition film composed mainly of silicon oxide and having a thickness of from 100 to 3,000 Å is continuously formed on the surface(s) of the traveling flexible plastic film.

2. A process for the manufacture of a deposition film according to claim 1 wherein the flexible plastic film is a monoaxially or biaxially stretched film.

3. A process for the manufacture of a deposition film according to claim 1 wherein the flexible plastic film is a preliminarily dried film.

4. A process for the manufacture of a deposition film according to claim 1 wherein the flexible plastic film has a thickness of 5 to 300 $\mu$m.

5. A process for the manufacture of a deposition film according to claim 1 wherein the deposition material contains at least one member selected from the group consisting of $SiO$, $Si_2O_3$, $Si_3O_4$ and $SiO_2$.

6. A process for the manufacture of a deposition film according to claim 1 wherein the deposition material further contains not more than 10%, of at least one metal selected from the group consisting of tin, magnesium, aluminum, indium, manganese and silver or at least one alloy of metals or at least one compound selected from the group consisting of oxides, silicides, silicates, nitrides, carbides and fluorides of said metals.

7. A process for the manufacture of a deposition film according to claim 1 wherein the deposition material is in the form of a cylinder, cube, pillar, tablet, pellet, rod or wire.

8. A process for the manufacture of a deposition film according to claim 1 wherein the shaped deposition material is obtained by drying or sintering the material during or after the shaping.

9. A process for the manufacture of a deposition film according to claim 1 wherein the deposition material is a powder having a size of not more than 100 mesh.

* * * * *